(12) United States Patent
Prabhat et al.

(10) Patent No.: US 12,002,533 B2
(45) Date of Patent: Jun. 4, 2024

(54) SYSTEM, METHOD AND/OR APPARATUS FOR MAGNETIC MEMORY TESTING

(71) Applicant: Arm Limited, Cambridge (GB)

(72) Inventors: Pranay Prabhat, Cambridge (GB); Mudit Bhargava, Austin, TX (US); Fernando Garcia Redondo, Cambridge (GB)

(73) Assignee: Arm Limited, Cambridge (GB)

( * ) Notice: Subject to any disclaimer, the term of this patent is extended or adjusted under 35 U.S.C. 154(b) by 100 days.

(21) Appl. No.: 17/814,418

(22) Filed: Jul. 22, 2022

(65) Prior Publication Data
US 2024/0029811 A1     Jan. 25, 2024

(51) Int. Cl.
*G11C 29/40*     (2006.01)
*G11C 29/44*     (2006.01)

(52) U.S. Cl.
CPC .................................. *G11C 29/44* (2013.01)

(58) Field of Classification Search
None
See application file for complete search history.

(56) References Cited

U.S. PATENT DOCUMENTS

| | | | |
|---|---|---|---|
| 2010/0238700 A1* | 9/2010 | Li | G11C 11/16 365/201 |
| 2016/0064058 A1* | 3/2016 | Janesky | G11C 29/12 365/158 |

OTHER PUBLICATIONS

Mamatha, et al, "International Journal of VLSI System Design and Communication Systems," Oct. 2014, ISSN 2322-0929, vol. 02, Issue 07, 6 Pages.
Salimy, et al, "Efficient Characterization and Testing of MRAM Devices, Parametric Testing for In-Line Monitoring," MRAM Developer Day, https://duckduckgo.com/?q=Efficient+Characterization+and+Testing+of+MRAM+Devices%2C+Parametric+Testing+for+In-Line+Monitoring&hps=1&atb=v262-1&ia=web, 2018, 11 Pages.
Tamura, et al, "A novel memory test system with an electromagnet for STT-MRAM testing," Downloaded on May 16, 2022 at 14:23:43 UTC from IEEE Xplore, Oct. 28-30, 2019, 4 Pages.
Hprobe.com, MRAM Test, "What is MRAM?," https://www.hprobe.com/mram-test/, Downloaded Aug. 23, 2022, 7 Pages.

* cited by examiner

*Primary Examiner* — Tan T. Nguyen
(74) *Attorney, Agent, or Firm* — Berkeley Law & Technology Group, LLP

(57) ABSTRACT

Briefly, embodiments, such as methods and/or systems for operations and/or procedures to test magnetic memory devices. In a particular implementation, a bit error rate of a magnetic memory device may be estimated based, at least in part, on an observed bit error rate in the presence of an externally applied magnetic field.

20 Claims, 6 Drawing Sheets

SYSTEM, METHOD AND/OR APPARATUS FOR MAGNETIC MEMORY TESTING

BACKGROUND

1. Field

This disclosure relates to techniques for testing magnetic memory devices.

2. Information

Magnetoresistive random-access memory (MRAM) is a type of non-volatile random-access memory which stores signals and/or states in magnetic domains. Unlike other random access memory technologies, storing signals and/or states as electric charge or current flows, MRAM stores signals and/or states by magnetic storage elements. These elements may be formed from two ferromagnetic plates, each of which can hold a magnetization, separated by a thin insulating layer. One of the two plates is a permanent magnet set to a particular polarity; the other plate's magnetization may be changed to match that of an external field to store memory. This configuration is known as a magnetic tunnel junction (MTJ).

BRIEF DESCRIPTION OF DRAWINGS

Claimed subject matter is particularly pointed out and distinctly claimed in the concluding portion of the specification. However, both as to organization and/or method of operation, together with objects, features, and/or advantages thereof, it may best be understood by reference to the following detailed description if read with the accompanying drawings in which:

Figure 1:
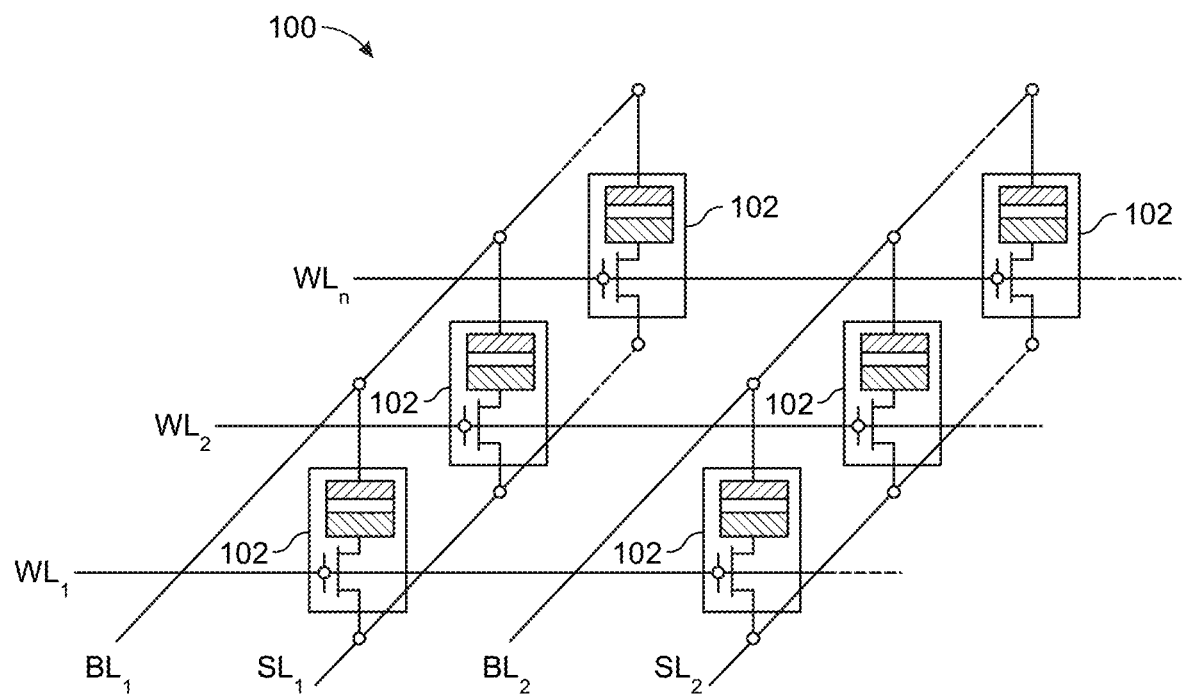
FIG. 1 is a schematic diagram of an array of magnetic memory elements, according to an embodiment.

Reference is made in the following detailed description to accompanying drawings, which form a part hereof, wherein like numerals may designate like parts throughout that are corresponding and/or analogous. It will be appreciated that the figures have not necessarily been drawn to scale, such as for simplicity and/or clarity of illustration. For example, dimensions of some aspects may be exaggerated relative to others. Furthermore, structural and/or other changes may be made without departing from claimed subject matter. It should also be noted that directions and/or references, for example, such as up, down, top, bottom, and so on, may be used to facilitate discussion of drawings and are not intended to restrict application of claimed subject matter. Therefore, the following detailed description is not to be taken to limit claimed subject matter and/or equivalents. Further, it is to be understood that other embodiments may be utilized. Also, embodiments have been provided of claimed subject matter and it is noted that, as such, those illustrative embodiments are inventive and/or unconventional; however, claimed subject matter is not limited to embodiments provided primarily for illustrative purposes. Thus, while advantages have been described in connection with illustrative embodiments, claimed subject matter is inventive and/or unconventional for additional reasons not expressly mentioned in connection with those embodiments. In addition, references throughout this specification to "claimed subject matter" refer to subject matter intended to be covered by one or more claims, and are not necessarily intended to refer to a complete claim set, to a particular combination of claim sets (e.g., method claims, apparatus claims, etc.), or to a particular claim.

DETAILED DESCRIPTION

References throughout this specification to one implementation, an implementation, one embodiment, an embodiment, and/or the like means that a particular feature, structure, characteristic, and/or the like described in relation to a particular implementation and/or embodiment is included in at least one implementation and/or embodiment of claimed subject matter. Thus, appearances of such phrases, for example, in various places throughout this specification are not necessarily intended to refer to the same implementation and/or embodiment or to any one particular implementation and/or embodiment. Furthermore, it is to be understood that particular features, structures, characteristics, and/or the like described are capable of being combined in various ways in one or more implementations and/or embodiments and, therefore, are within intended claim scope. In general, of course, as has always been the case for the specification of a patent application, these and other issues have a potential to vary in a particular context of usage. In other words, throughout the patent application, particular context of description and/or usage provides helpful guidance regarding reasonable inferences to be drawn; however, likewise, "in this context" in general without further qualification refers to the context of the present patent application.

Like other non-volatile memory devices, magnetoresistive random-access memory (MRAM) devices may be formed as arrays of cells that are accessible for read and/or write operations by application of signals to associated wordlines and bitlines. FIG. 1 is a schematic diagram of an array 100 of magnetic memory elements in which a magnetic memory cell 102 may be selected for a read or write operation by application of signals to an associated wordline WL and bitline BL. In an embodiment, MRAM arrays may be of the order of 16-64 Mb per chip, with a relatively narrow 32 to 128 bit interface. To qualify an array in a production test, an array location may be read from and/or written to applying a so-called "March" memory test pattern. Additionally, MRAM arrays may have very low stochastic error rates on the order of less than 1 ppm. For small arrays (e.g. 1 Mb), a number of failing bits detected may not be statistically significant for an accurate determination of a bit error rate (BER). Even for large arrays, multiple test passes may be required to bring the number of stochastic failures up to a statistically significant level, further increasing test time and cost. Given relatively low stochastic error rates associated with MRAM arrays as well as narrow interfaces to an MRAM device, testing MRAM devices by repetitively writing to and reading from individual magnetic memory cells in an MRAM array may be time consuming and costly.

According to an embodiment, under test a magnetic field may be applied to an integrated magnetic memory device applied from an external source to stress and/or exaggerate errors during test operations. By providing conditions to stress and/or exaggerate errors, a magnetic memory device may be adequately tested with fewer passes of write/read test cycles. Read and/or write error rates of a tested magnetic memory array may then be estimated based, at least in part, on states read from the tested array.

Figure 2:
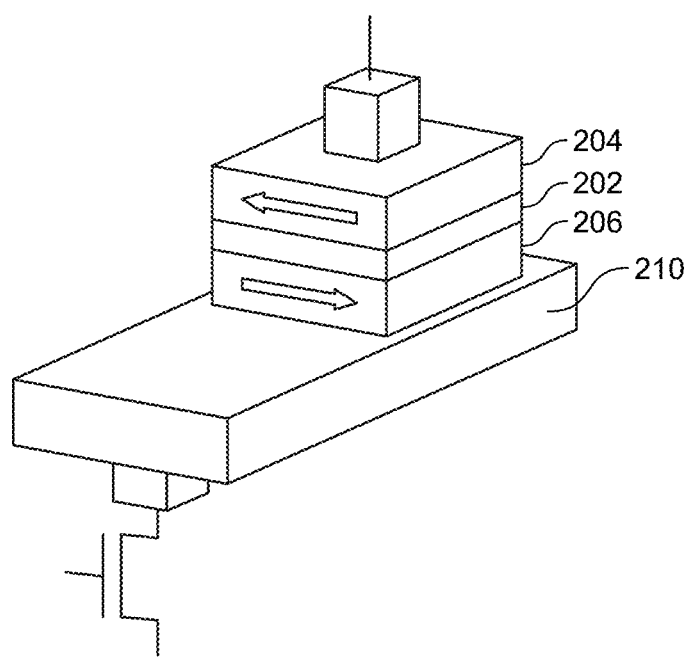
FIG. 2 is a schematic diagram of a magnetic memory cell according to an embodiment.

According to an embodiment, a magnetic memory cell 102 (FIG. 1) may be implemented as magnetic memory cell 200 as shown in FIG. 2. In an embodiment, magnetic memory device 200 may comprise, for example, a Spin-Orbit-Torque Magnetic Tunnel Junction (SOT-MTJ) or a Spin-Transfer Torque (STT-MTJ) memory device. For example, magnetic memory device 200 may comprise a metal layer, such as metal layer 210, and/or may further include a magnetic tunnel junction (MJT) stack formed by layers 202, 204 and 206. In an embodiment, metal layer 210 may comprise, for example, tantalum (Ta), platinum (Pt), etc. Of course, metal layer 210 is not limited in scope to these particular elements.

Layers 204 and 206 may be formed from a magnetic material such as CoFeB, for example. An insulating layer 202 may comprise MgO, for example. However, claimed subject matter is not limited in scope to the particular materials mentioned for an MJT formed by layers 202, 204 and 206. In an embodiment, layer 206 may be formed as a "pinned" magnetic layer (e.g., magnetic field is fixed in a particular polarization/orientation). Layer 204, on the other hand, may be formed as a magnetic "free" layer (e.g., magnetic field orientation may be switched to match the orientation of an external field). In an embodiment, the orientation of the magnetic field within magnetic free layer 206 may depend at least in part on a direction of a current to have flowed through metal layer 210. For example, for a current flowing through metal layer 210 in a first direction, a magnetic field of magnetic free layer 204 may be oriented in a first direction. Also, for example, for a current flowing through metal layer 210 in a second direction, the magnetic field of magnetic free layer 204 may be oriented in a second direction.

In an embodiment, magnetic fields within pinned magnetic layer 206 and/or magnetic free layer 204 may be oriented in the same direction or may be oriented in opposite directions depending on a direction of a current to have flowed through metal layer 210. In an embodiment, if an orientation of magnetic fields within magnetic free layer 204 and pinned magnetic layer 208 are substantially the same, then the MTJ stack formed by layers 202, 204 and 206 may be in a so-called "P" state to exhibit a characteristic of a relatively lower resistance. Conversely, if orientations of magnetic fields within magnetic free layer 204 and pinned magnetic layer 206 are substantially opposite, then the MTJ stack formed by layers 202, 204 and 206 may be in a so-called "AP" state to exhibit a characteristic of a relatively higher resistance. In an embodiment, a current flow in one direction through metal layer 210 may result in a lower resistance across layers 202, 204 and 206, for example. Further, in an embodiment, a current flow in one direction through metal layer 210 may result in a higher resistance across layers 202, 204 and 206, for example. In this manner, for example, a data value (e.g., signal and/or state) may be written to non-volatile magnetic memory element 200. Of course, claimed subject matter is not limited in scope to these particular examples. Additionally, in an embodiment, a data value (e.g., signal and/or state) may be read from non-volatile magnetic memory cell 200 by sensing a resistance across layers 202, 204 and 206.

FIGS. 3A, 3B, 3C and 3D are plots of error performance of typical magnetic memory elements under various conditions. As discussed below, one or more of these plots may be applied to extrapolate an estimated bit error rate of a memory device under normal operational conditions based, at least in part, on bit error rate performance of the memory device under an externally applied magnetic field.

According to an embodiment, an array of magnetic memory cells (such as magnetic memory cell 200) may be exposed to a magnetic field generated by an external source during operations to test the array to, for example, assess a bit error rate. In one embodiment, exposure to such application a magnetic field generated by an external source may be limited to during write operations if write error rates are to be observed. In another embodiment, exposure to such application a magnetic field generated by an external source may be limited to during read operations if read error rates are to be observed. As pointed out above, a magnetic layer in an MTJ device (e.g., layer 206) may be permanently magnetically polarized in a fixed direction/orientation. In a particular implementation, a magnetic field generated by an external source applied in operations to test an MTJ device (e.g., in an array of MTJ devices) may be polarized in the same direction as that of a permanently polarized magnetic layer of the MTJ device. If the MTJ device is in the "P" state (i.e., orientations of magnetic fields within magnetic free and pinned magnetic layers are substantially the same), the MJT device may be predisposed to remain in the "P" state, making it difficult to transition to the "AP" state. This may manifest an increase in detected write errors. Likewise, if the MTJ device is in the "AP" state (i.e., orientations of magnetic fields within magnetic free and pinned magnetic layers are substantially opposed), the MJT device may be predisposed to transition from the "AP" state to the "P" state, making it difficult to remain in the "AP" state. This may manifest an increase in detected read upset errors, for example.

Alternatively, a magnetic field generated by an external source applied in operations to test an MTJ device (e.g., in an array of MTJ devices) may be polarized in an opposite direction as that of as permanently polarized magnetic layer of the MTJ device. If the MTJ device is in the "P" state (i.e., orientations of magnetic fields within magnetic free and pinned magnetic layers are substantially the same), the MTJ device may be predisposed to transition from the "P" state to the "AP" state, making it difficult to remain in the "P" state. This may manifest an increase in detected read upset errors. Likewise, if the MTJ device is in the "AP" state (i.e., orientations of magnetic fields within magnetic free and pinned magnetic layers are substantially opposed), the MJT device may be predisposed to remain in the "AP" state, making it difficult to transition to the "P" state. This may manifest an increase in detected write errors, for example.

Figure 4:
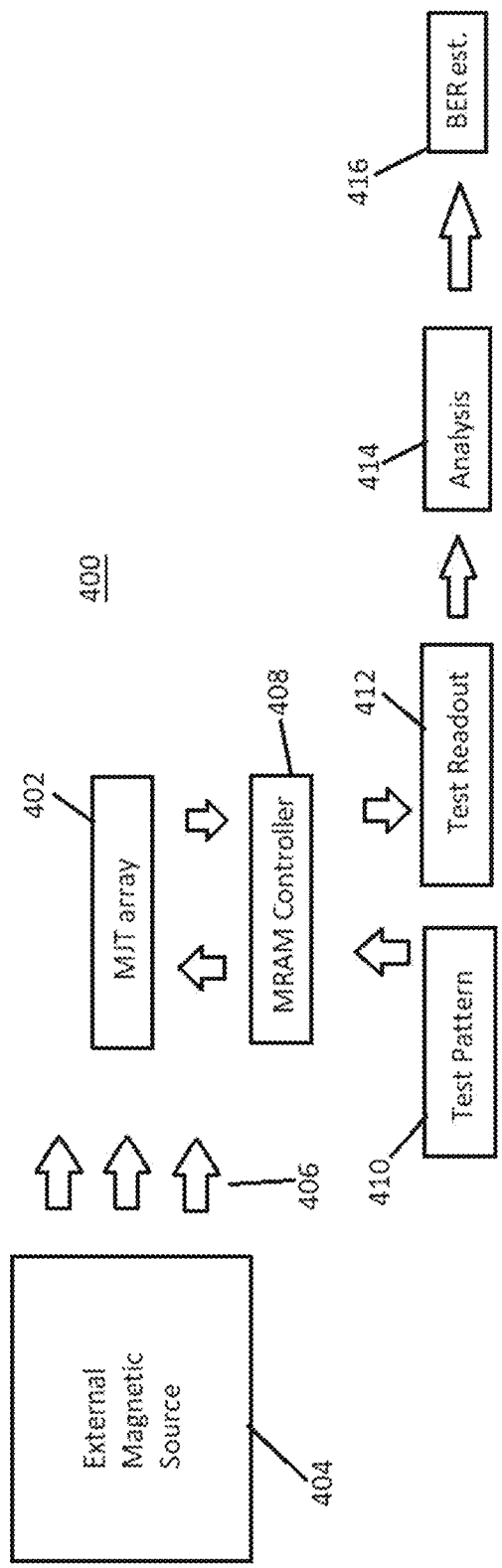
FIG. 4 is an apparatus for implementing a test operation for an array of magnetic memory elements, according to an embodiment.

FIG. 4 is a system 400 for implementing a test operation for an array of magnetic memory elements 402, according to an embodiment. In a particular implementation, array of magnetic memory elements 402 may be formed in an integrated circuit (IC) die prior to or following packaging of the die in a commercial device. Additionally, array of magnetic memory elements 402 may be formed as an array of MJTs such as magnetic memory device 200 in which associated permanent pinned magnetic layers (e.g., pinned magnetic lager 206) are polarized in the same direction over the entirety of array 402. In other embodiments, a magnetic memory element in array of magnetic memory elements 402 may include multiple pinned and/or free magnetic layers such that different combinations of polarization of layers may occur. In one embodiment, external magnetic source 404 may generate a magnetic field 406 that polarized in a same direction as that of the permanent pinned magnetic layer(s) of magnetic memory elements in MJT array 402. In another embodiment, external magnetic source 404 may generate magnetic field 406 to be polarized in an opposite direction as that of the permanent pinned magnetic layer(s) of magnetic memory elements in MJT array 402. In this context, a "write operation" as referred to herein means an operation implemented by a circuit to place one or more memory cells in one or more particular memory states. For example, a write operation may comprise generation of one or more "programming signals" having particular properties (e.g., a voltage and/or current) which may be applied to one or more portions of a bit-cell to place the bit-cell in one or more particular memory states (e.g., a memory state that is detectable in a subsequent read operation).

According to an embodiment, MRAM controller 408 may initiate write operations to place individual MJT memory elements of MJT array 402 in a "1" state or "0" state according to test pattern(s) 410. Following such write operations executed by MRAM controller 408, MRAM controller 408 may initiate read operations detect states of individual MJT memory elements of MJT array 402. In this context, a "read operation" as referred to herein refers to an operation implemented by a circuit to detect one or more memory states of one or more bit-cells. Detected states of individual MJT memory elements of MJT array 402 may be formatted into a test readout 412 including a "1" state or "0" state associated with detected states of the individual MJT memory elements of MJT array 402.

According to an embodiment, values/states defined in test pattern(s) 410 and applied in write operations (by MRAM controller 408) may be compared at analysis 414 to identify read and/or write error events. According to an embodiment, test pattern(s) 410 may comprise application of multiple write/read cycles to individual MJT memory elements including, for example transitions from a "P" state (e.g., representing a "1") to an "AP" state (e.g., to represent a "0"), and transitions from an "AP" state (e.g., representing a "0") to an "P" state (e.g., to represent a "1"). Depending on a polarization of magnetic field 406 relative to a polarization of a permanent magnetic layer of an MJT memory element in MJT array 402, an error in such a transition may be presumed to be a write error or a read error as summarized in Table 1 below.

TABLE 1

| Attempted operation | Value Transition | Detected State (read out after test cycle with zero external magnetic field) | External Magnetic Field Polarization | Error Type |
|---|---|---|---|---|
| Write 1 | 0→0 | 0 | opposite permanent magnetic layer | write |
| Write 0 | 1→1 | 1 | same as permanent magnetic layer | write |
| Read 1 | 1→0 | 0 | opposite permanent magnetic layer | read upset |
| Read 0 | 0→1 | 1 | same as permanent magnetic layer | read upset |

Figure 3A:
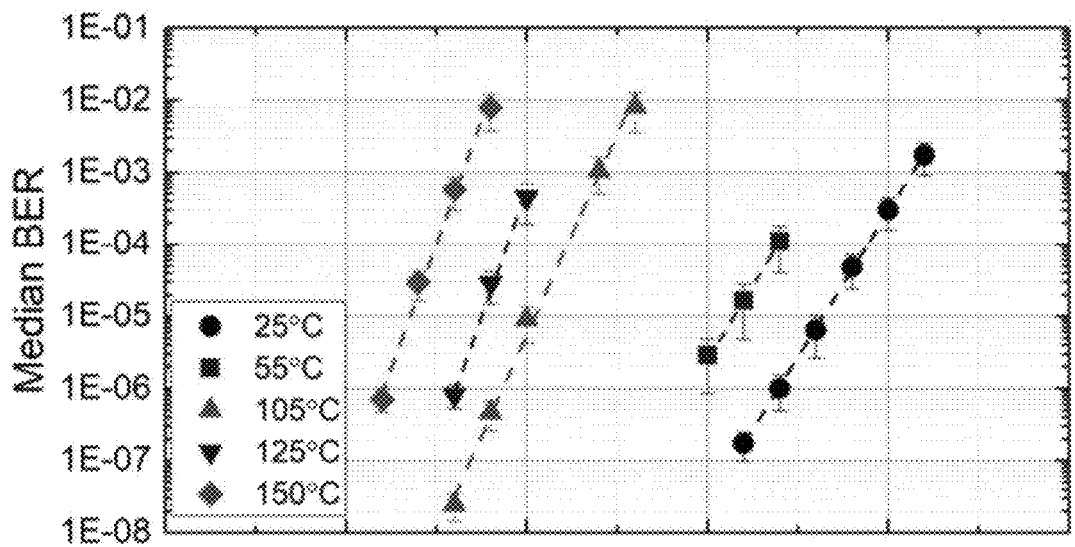
FIGS. 3A through 3D are plots of performance of certain magnetic memory devices under certain conditions, according to an embodiment.
Figure 3B:
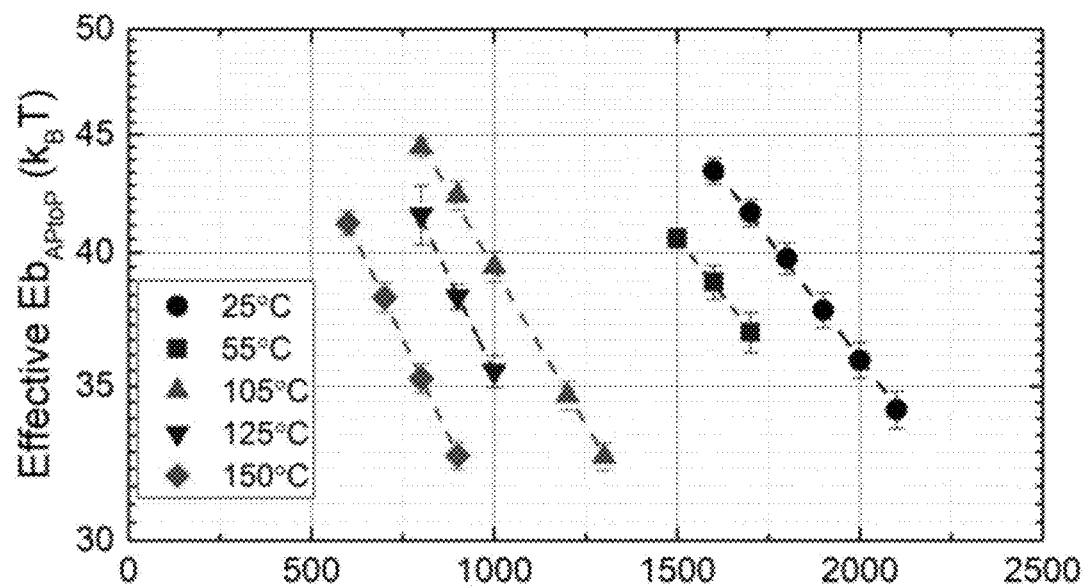
Figure 3C:
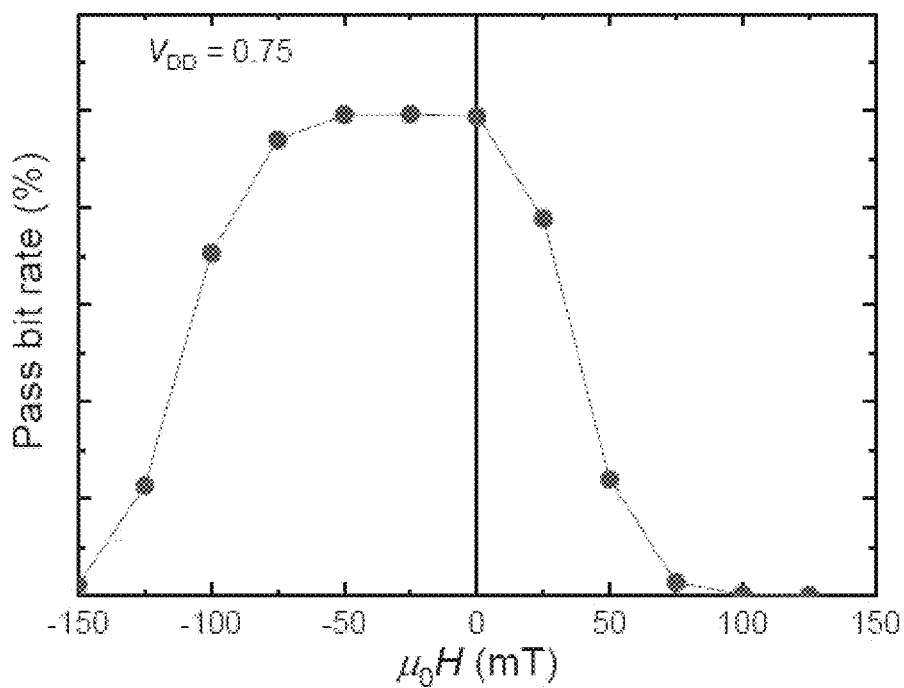
Figure 3D:
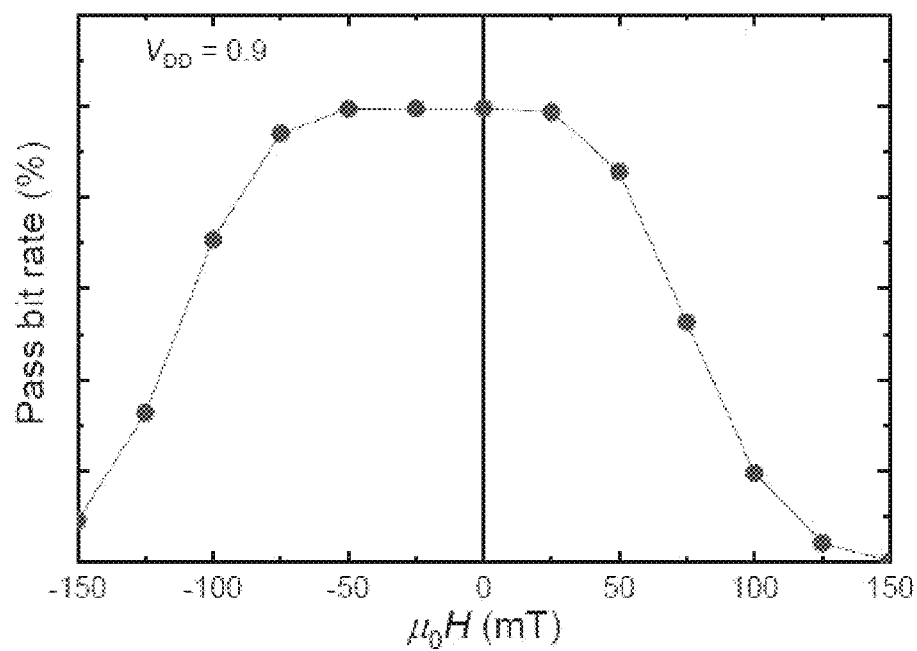

Based, at least in part, on error events detected from a comparison of test pattern(s) 410 and test readout 412, analysis 414 may estimate a bit error rate for write errors and/or read errors for MJT array 402. For example, analysis 414 may compute an estimated bit error rate 416 (e.g., estimated read and/or write error rate) based, at least in part, on a count of read and write errors and a quantified relationship between expected read and/or write error rates in the presence of different levels of an ambient magnetic field. In one example implementation, such a quantitative relationship may be based, at least in part, on an observed behavior of a benchmark magnetic memory device in the presence of different levels of an ambient magnetic field such as shown in FIGS. 3C and 3D, for example.

Figure 5:
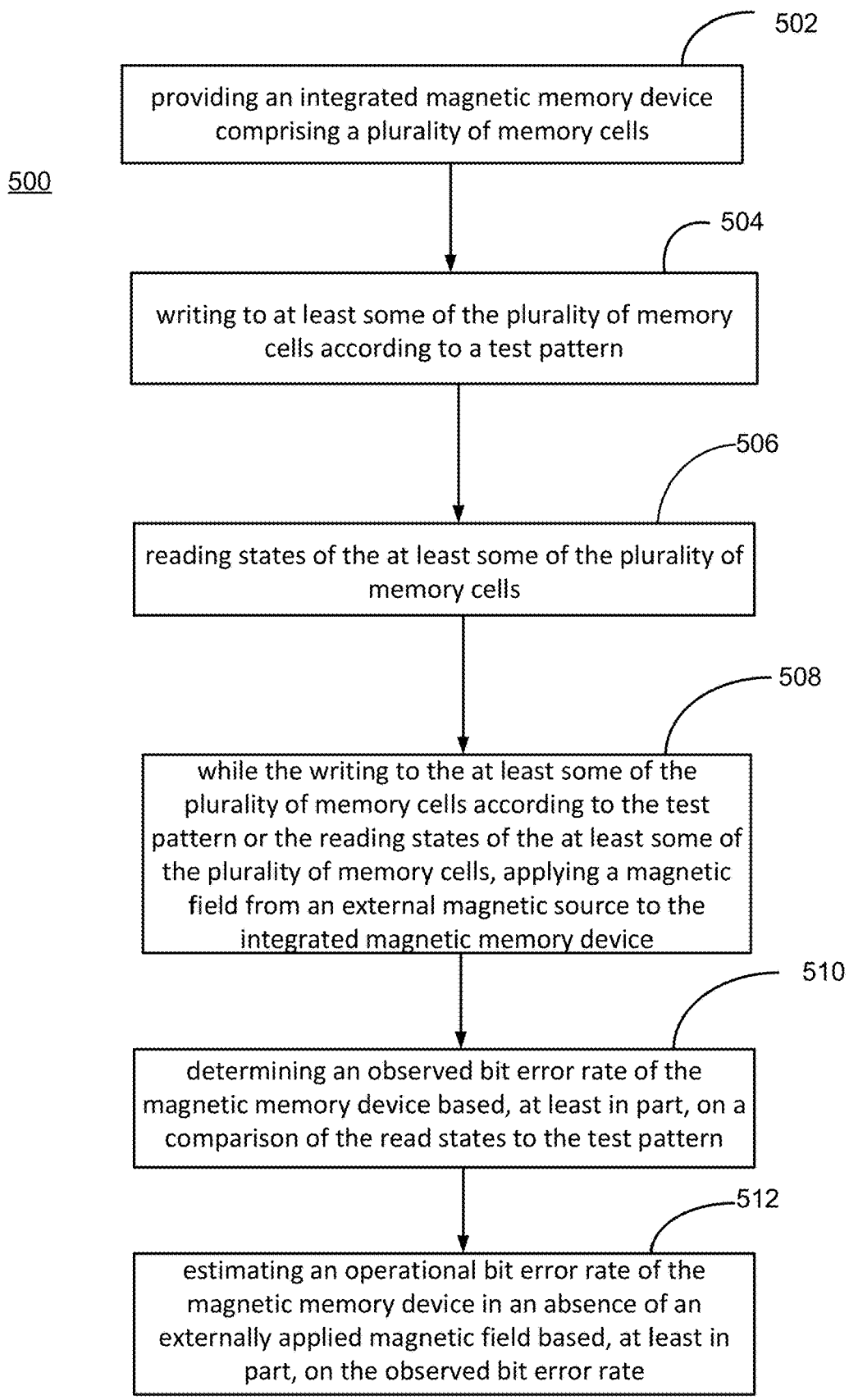
FIG. 5 is a flow diagram of a process to implement test operation for an array of magnetic memory elements, according to an embodiment.

FIG. 5 is a flow diagram of a process 500 to implement test operation for an array of magnetic memory elements, according to an embodiment. Block 502 may comprise providing an integrated memory device such as, for example, a device comprising an array of MJT memory elements such as array 100 and/or MJT array 402, just to provide a couple of examples. Block 504 may comprise writing to individual MJT memory cells according to a test pattern such as, for example, executing write operations by MRAM controller 408 based, at least in part, on test pattern (s) 410. Block 506 may comprise reading states of magnetic memory cells following write operations by, for example, initiating read operations from a memory controller, such as MRAM controller 408, to provide test results, such as test readout 412.

According to an embodiment, block 504 and/or 506 may be executed in the presence of a magnetic field generated by an external source applied at block 508 such as magnetic field 406 generated by external magnetic source 404, for example. Additionally, blocks 504 and 506 may be executed repeatedly in an alternating fashion to enable observations of transitions between "P" and "AP" states responsive to write operations and in the presence of an externally generated magnetic field polarized in the same and opposite directions of a polarization of a permanent magnetic layer. Block 510 may determine an observed bit error rate based, at least in part, on a comparison of a test pattern applied in write operations at block 504 and observed states of individual magnetic memory cells obtained in read operations at block 506.

According to an embodiment, blocks 504 and 506 may occur in repeating cycles where observations obtained in read cycles at block 506 are compared with an applied test pattern over multiple cycles, and block 510 determines an observed bit error rate based on comparisons of an applied test pattern with read states accumulated over multiple write/read cycles. In a particular implementation, a test pattern applied at blocks 504 and 510 may be varied over read and write cycles. Also, application of a magnetic field from an external magnetic source may be synchronized over read and write cycles. In one embodiment, such magnetic field may be varied by varying a polarity of the magnetic field. In another embodiment, such a magnetic field may be varied in intensity over read/write cycles.

According to an embodiment, block 512 may estimate an operational bit error rate of a magnetic memory device (e.g., in the absence of a magnetic field applied by an external magnetic source) based at, least in part, on an observed bit error rate determined at block 508. For example, block 512 may extrapolate an estimated operational bit error rate from a plot of bit error rate of a benchmark magnetic memory device versus a magnitude of a magnetic field applied to the benchmark magnetic memory device. To estimate an operational read error rate, block 510 may extrapolate a read error rate or a write error rate from a plot of FIG. 3C and/or FIG. 3D. Here, FIG. 3C may plot an observed bit pass rate for a benchmark magnetic memory device based on detected read errors while FIG. 3D may plot an observed bit pass rate for a benchmark magnetic memory device based on detected write errors. While the particular plots of FIG. 3C and FIG. 3D express a pass bit rate as a function of ambient magnetic field, it should be understood that a pass bit rate (PBR) translates to a bit error rate (BER) as PBR=1−BER. In a particular implementation, block 510 may determine estimate a bit error rate according to expression (1) as follows:

$$\widehat{BER} = f[BER_{BM}(\vec{B}), BER_o(\vec{B})], \quad (1)$$

where:

$\widehat{BER}$ is an estimated operational read or write bit error rate of a magnetic memory device under test;

$BER_o(\vec{B})$ is an observed read or write bit error rate of the magnetic memory device under test in the presence of an ambient magnetic field $\vec{B}$ from an external source; and $BER_{BM}(\vec{B})$ is a read or write bit error rate of a benchmark magnetic memory device obtained from a plot at an ambient magnetic field $\vec{B}$.

According to an embodiment, a value for $BER_o(\vec{B})$ may be obtained, at least in part, from test readout 412. For individual cases identified/presumed as read errors (e.g., from cases identified in TABLE 1 as read errors), expression (1) may be applied with a value for $BER_{BM}(\vec{B})$ obtained from the plot of FIG. 3D. Likewise, for individual cases identified/presumed as read errors (e.g., from cases identified in TABLE 1 as read errors), expression (1) may be applied with a value for $BER_{BM}(\vec{B})$ obtained from the plot of FIG. 3F. According to an embodiment, expression (1) for estimating an operational read or write bit error rate may be implemented using a look-up table. In an example implementation, a value for $BER_o(\vec{B})$ may be set to a constant to be determined while $\vec{B}$ is at a high/peak value, say $\vec{B}_o$. A look-up table may be generated based on FIG. 3C or 3D, for example, in which a curve for $BER_{BM}(\vec{B})$ is scaled up or down by a constant to match $BER_{BM}(\vec{B}_o)=BER_o(\vec{B})$. A value for $\widehat{BER}$ may then be interpolated from the lookup table. Other techniques may employ multivariable/multidimensional curve fitting taking into account actors other than ambient magnetic field such as temperature.

In the context of the present patent application, the term "connection," the term "component" and/or similar terms are intended to be physical, but are not necessarily always tangible. Whether or not these terms refer to tangible subject matter, thus, may vary in a particular context of usage. As an example, a tangible connection and/or tangible connection path may be made, such as by a tangible, electrical connection, such as an electrically conductive path comprising metal or other conductor, that is able to conduct electrical current between two tangible components. Likewise, a tangible connection path may be at least partially affected and/or controlled, such that, as is typical, a tangible connection path may be open or closed, at times resulting from influence of one or more externally derived signals, such as external currents and/or voltages, such as for an electrical switch. Non-limiting illustrations of an electrical switch include a transistor, a diode, etc. However, a "connection" and/or "component," in a particular context of usage, likewise, although physical, can also be non-tangible, such as a connection between a client and a server over a network, particularly a wireless network, which generally refers to the ability for the client and server to transmit, receive, and/or exchange communications, as discussed in more detail later.

In a particular context of usage, such as a particular context in which tangible components are being discussed, therefore, the terms "coupled" and "connected" are used in a manner so that the terms are not synonymous. Similar terms may also be used in a manner in which a similar intention is exhibited. Thus, "connected" is used to indicate that two or more tangible components and/or the like, for example, are tangibly in direct physical contact. Thus, using the previous example, two tangible components that are electrically connected are physically connected via a tangible electrical connection, as previously discussed. However, "coupled," is used to mean that potentially two or more tangible components are tangibly in direct physical contact. Nonetheless, "coupled" is also used to mean that two or more tangible components and/or the like are not necessarily tangibly in direct physical contact, but are able to co-operate, liaise, and/or interact, such as, for example, by being "optically coupled." Likewise, the term "coupled" is also understood to mean indirectly connected. It is further noted, in the context of the present patent application, since memory, such as a memory component and/or memory states, is intended to be non-transitory, the term physical, at least if used in relation to memory necessarily implies that such memory components and/or memory states, continuing with the example, are tangible.

Additionally, in the present patent application, in a particular context of usage, such as a situation in which tangible components (and/or similarly, tangible materials) are being discussed, a distinction exists between being "on" and being "over." As an example, deposition of a substance "on" a substrate refers to a deposition involving direct physical and tangible contact without an intermediary, such as an intermediary substance, between the substance deposited and the substrate in this latter example; nonetheless, deposition "over" a substrate, while understood to potentially include deposition "on" a substrate (since being "on" may also accurately be described as being "over"), is understood to include a situation in which one or more intermediaries, such as one or more intermediary substances, are present between the substance deposited and the substrate so that the substance deposited is not necessarily in direct physical and tangible contact with the substrate.

A similar distinction is made in an appropriate particular context of usage, such as in which tangible materials and/or tangible components are discussed, between being "beneath" and being "under." While "beneath," in such a particular context of usage, is intended to necessarily imply physical and tangible contact (similar to "on," as just described), "under" potentially includes a situation in which there is direct physical and tangible contact, but does not necessarily imply direct physical and tangible contact, such as if one or more intermediaries, such as one or more intermediary substances, are present. Thus, "on" is understood to mean "immediately over" and "beneath" is understood to mean "immediately under."

It is likewise appreciated that terms such as "over" and "under" are understood in a similar manner as the terms "up," "down," "top," "bottom," and so on, previously mentioned. These terms may be used to facilitate discussion, but are not intended to necessarily restrict scope of claimed subject matter. For example, the term "over," as an example, is not meant to suggest that claim scope is limited to only situations in which an embodiment is right side up, such as in comparison with the embodiment being upside down, for example. An example includes a flip chip, as one illustration, in which, for example, orientation at various times (e.g., during fabrication) may not necessarily correspond to orientation of a final product. Thus, if an object, as an example, is within applicable claim scope in a particular orientation, such as upside down, as one example, likewise, it is intended that the latter also be interpreted to be included within applicable claim scope in another orientation, such as right side up, again, as an example, and vice-versa, even if applicable literal claim language has the potential to be interpreted otherwise. Of course, again, as always has been the case in the specification of a patent application, particular context of description and/or usage provides helpful guidance regarding reasonable inferences to be drawn.

Unless otherwise indicated, in the context of the present patent application, the term "or" if used to associate a list, such as A, B, or C, is intended to mean A, B, and C, here used in the inclusive sense, as well as A, B, or C, here used in the exclusive sense. With this understanding, "and" is used in the inclusive sense and intended to mean A, B, and C; whereas "and/or" can be used in an abundance of caution to make clear that all of the foregoing meanings are intended, although such usage is not required. In addition, the term "one or more" and/or similar terms is used to describe any feature, structure, characteristic, and/or the like in the singular, "and/or" is also used to describe a plurality and/or some other combination of features, structures, characteristics, and/or the like. Likewise, the term "based on" and/or similar terms are understood as not necessarily intending to convey an exhaustive list of factors, but to allow for existence of additional factors not necessarily expressly described.

To the extent claimed subject matter is related to one or more particular measurements, such as with regard to physical manifestations capable of being measured physically, such as, without limit, temperature, pressure, voltage, current, electromagnetic radiation, etc., it is believed that claimed subject matter does not fall within the abstract idea judicial exception to statutory subject matter. Rather, it is asserted, that physical measurements are not mental steps and, likewise, are not abstract ideas.

The terms "correspond", "reference", "associate", and/or similar terms relate to signals, signal samples and/or states, e.g., components of a signal measurement vector, which may be stored in memory and/or employed with operations to generate results, depending, at least in part, on the above-mentioned, signal samples and/or signal sample states. For example, a signal sample measurement vector may be stored in a memory location and further referenced wherein such a reference may be embodied and/or described as a stored relationship. A stored relationship may be employed by associating (e.g., relating) one or more memory addresses to one or more another memory addresses, for example, and may facilitate an operation, involving, at least in part, a combination of signal samples and/or states stored in memory, such as for processing by a processor and/or similar device, for example. Thus, in a particular context, "associating," "referencing," and/or "corresponding" may, for example, refer to an executable process of accessing memory contents of two or more memory locations, e.g., to facilitate execution of one or more operations among signal samples and/or states, wherein one or more results of the one or more operations may likewise be employed for additional processing, such as in other operations, or may be stored in the same or other memory locations, as may, for example, be directed by executable instructions. Furthermore, terms "fetching" and "reading" or "storing" and "writing" are to be understood as interchangeable terms for the respective operations, e.g., a result may be fetched (or read) from a memory location; likewise, a result may be stored in (or written to) a memory location.

It is further noted that the terms "type" and/or "like," if used, such as with a feature, structure, characteristic, and/or the like, using "optical" or "electrical" as simple examples, means at least partially of and/or relating to the feature, structure, characteristic, and/or the like in such a way that presence of minor variations, even variations that might otherwise not be considered fully consistent with the feature, structure, characteristic, and/or the like, do not in general prevent the feature, structure, characteristic, and/or the like from being of a "type" and/or being "like," (such as being an "optical-type" or being "optical-like," for example) if the minor variations are sufficiently minor so that the feature, structure, characteristic, and/or the like would still be considered to be substantially present with such variations also present. Thus, continuing with this example, the terms optical-type and/or optical-like properties are necessarily intended to include optical properties. Likewise, the terms electrical-type and/or electrical-like properties, as another example, are necessarily intended to include electrical properties. It should be noted that the specification of the present patent application merely provides one or more illustrative examples and claimed subject matter is intended to not be limited to one or more illustrative examples; however, again, as has always been the case with respect to the specification of a patent application, particular context of description and/or usage provides helpful guidance regarding reasonable inferences to be drawn.

With advances in technology, it has become more typical to employ distributed computing and/or communication approaches in which portions of a process, such as signal processing of signal samples, for example, may be allocated among various devices, including one or more client devices and/or one or more server devices, via a computing and/or communications network, for example. A network may comprise two or more devices, such as network devices and/or computing devices, and/or may couple devices, such as network devices and/or computing devices, so that signal communications, such as in the form of signal packets and/or signal frames (e.g., comprising one or more signal samples), for example, may be exchanged, such as between a server device and/or a client device, as well as other types of devices, including between wired and/or wireless devices coupled via a wired and/or wireless network, for example.

In the context of the present patent application, the terms "entry," "electronic entry," "document," "electronic document," "content", "digital content," "item," and/or similar terms are meant to refer to signals and/or states in a physical format, such as a digital signal and/or digital state format, e.g., that may be perceived by a user if displayed, played, tactilely generated, etc. and/or otherwise executed by a device, such as a digital device, including, for example, a computing device, but otherwise might not necessarily be readily perceivable by humans (e.g., if in a digital format). Likewise, in the context of the present patent application, digital content provided to a user in a form so that the user is able to readily perceive the underlying content itself (e.g., content presented in a form consumable by a human, such as hearing audio, feeling tactile sensations and/or seeing images, as examples) is referred to, with respect to the user, as "consuming" digital content, "consumption" of digital content, "consumable" digital content and/or similar terms. For one or more embodiments, an electronic document and/or an electronic file may comprise a Web page of code (e.g., computer instructions) in a markup language executed or to be executed by a computing and/or networking device, for example. In another embodiment, an electronic document and/or electronic file may comprise a portion and/or a region of a Web page. However, claimed subject matter is not intended to be limited in these respects.

It has proven convenient at times, principally for reasons of common usage, to refer to such physical signals and/or physical states as bits, values, elements, parameters, symbols, characters, terms, numbers, numerals, measurements, content and/or the like. It should be understood, however, that all of these and/or similar terms are to be associated with appropriate physical quantities and are merely convenient labels. Unless specifically stated otherwise, as apparent from the preceding discussion, it is appreciated that throughout this specification discussions utilizing terms such as "processing," "computing," "calculating," "determining", "establishing", "obtaining", "identifying", "selecting", "generating", and/or the like may refer to actions and/or processes of a specific apparatus, such as a special purpose computer and/or a similar special purpose computing and/or network device. In the context of this specification, therefore, a special purpose computer and/or a similar special purpose computing and/or network device is capable of processing, manipulating and/or transforming signals and/or states, typically in the form of physical electronic and/or magnetic quantities, within memories, registers, and/or other storage devices, processing devices, and/or display devices of the special purpose computer and/or similar special purpose computing and/or network device. In the context of this particular patent application, as mentioned, the term "specific apparatus" therefore includes a general purpose computing and/or network device, such as a general purpose computer, once it is programmed to perform particular functions, such as pursuant to program software instructions.

In some circumstances, operation of a memory device, such as a change in state from a binary one to a binary zero or vice-versa, for example, may comprise a transformation, such as a physical transformation. With particular types of memory devices, such a physical transformation may comprise a physical transformation of an article to a different state or thing. For example, but without limitation, for some types of memory devices, a change in state may involve an accumulation and/or storage of charge or a release of stored charge. Likewise, in other memory devices, a change of state may comprise a physical change, such as a transformation in magnetic orientation. Likewise, a physical change may comprise a transformation in molecular structure, such as from crystalline form to amorphous form or vice-versa. In still other memory devices, a change in physical state may involve quantum mechanical phenomena, such as, superposition, entanglement, and/or the like, which may involve quantum bits (qubits), for example. The foregoing is not intended to be an exhaustive list of all examples in which a change in state from a binary one to a binary zero or vice-versa in a memory device may comprise a transformation, such as a physical, but non-transitory, transformation. Rather, the foregoing is intended as illustrative examples.

Figure 6:
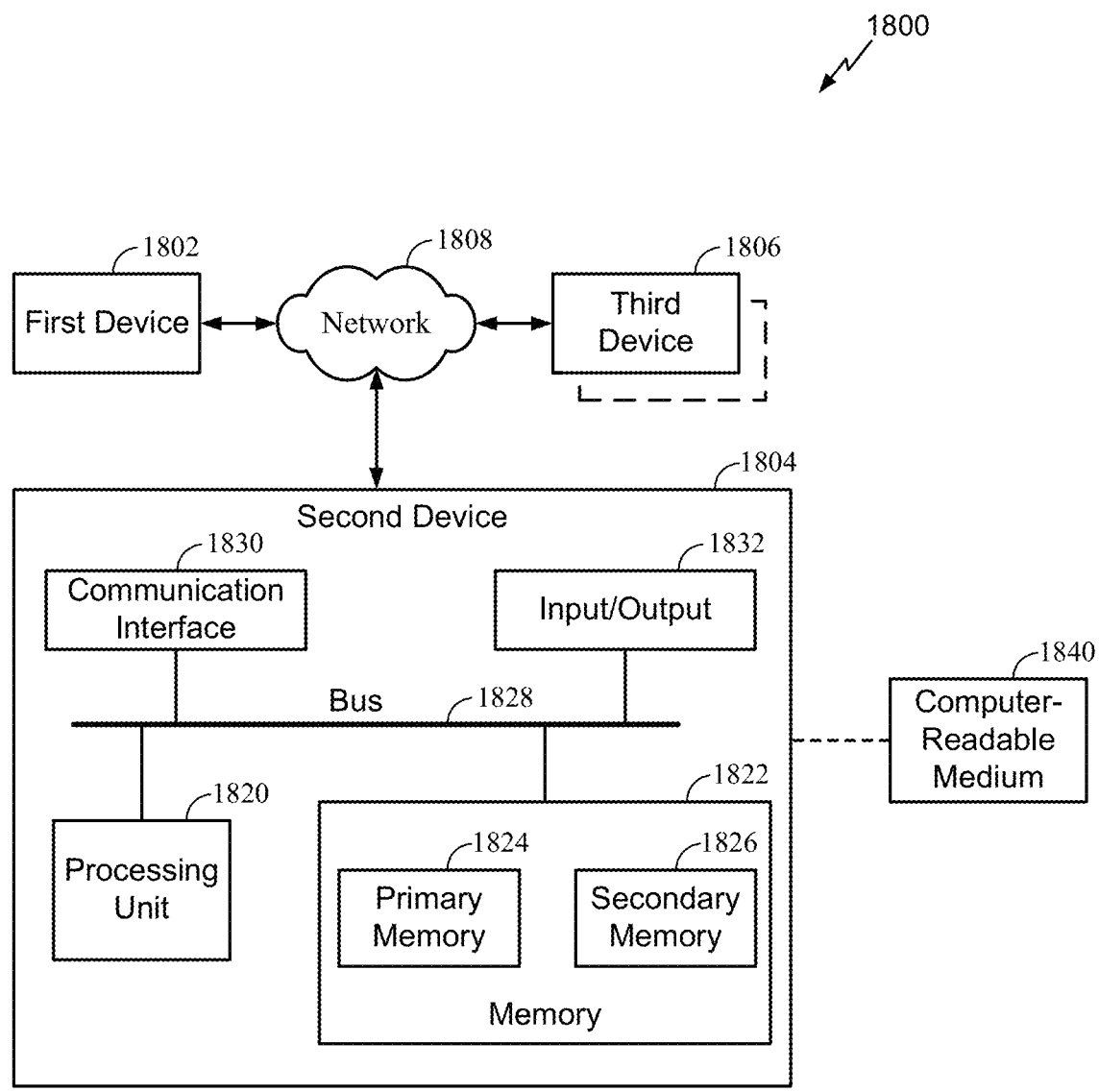
FIG. 6 is a schematic block diagram of an example computing system in accordance with an implementation.

Example devices in FIG. 6 may comprise features, for example, of a client computing device and/or a server computing device, in an embodiment. It is further noted that the term computing device, in general, whether employed as a client and/or as a server, or otherwise, refers at least to a processor and a memory connected by a communication bus. A "processor" and/or "processing circuit" for example, is understood to connote a specific structure such as a central processing unit (CPU), digital signal processor (DSP), graphics processing unit (GPU) and/or neural network processing unit (NPU), or a combination thereof, of a computing device which may include a control unit and an execution unit. In an aspect, a processor and/or processing circuit may comprise a device that fetches, interprets and executes instructions to process input signals to provide output signals. As such, in the context of the present patent application at least, this is understood to refer to sufficient structure within the meaning of 35 USC § 112 (f) so that it is specifically intended that 35 USC § 112 (f) not be implicated by use of the term "computing device," "processor," "processing unit," "processing circuit" and/or similar terms; however, if it is determined, for some reason not immediately apparent, that the foregoing understanding cannot stand and that 35 USC § 112 (f), therefore, necessarily is implicated by the use of the term "computing device" and/or similar terms, then, it is intended, pursuant to that statutory section, that corresponding structure, material and/or acts for performing one or more functions be understood and be interpreted to be described at least in FIGS. 4 and 5, and in the text associated with the foregoing figure(s) of the present patent application.

In an embodiment, first and third devices 1802 and 1806 may be capable of rendering a graphical user interface (GUI) for a network device and/or a computing device, for example, so that a user-operator may engage in system use. Device 1804 may potentially serve a similar function in this illustration. Likewise, in FIG. 6, computing device 1802 ('first device' in figure) may interface with computing device 1804 ('second device' in figure), which may, for example, also comprise features of a client computing device and/or a server computing device, in an embodiment. Processor (e.g., processing device) 1820 and memory 1822, which may comprise primary memory 1824 and secondary memory 1826, may communicate by way of a communication bus 1815, for example. The term "computing device," in the context of the present patent application, refers to a system and/or a device, such as a computing apparatus, that includes a capability to process (e.g., perform computations) and/or store digital content, such as electronic files, electronic documents, measurements, text, images, video, audio, etc. in the form of signals and/or states. Thus, a computing device, in the context of the present patent application, may comprise hardware, software, firmware, or any combination thereof (other than software per se). Computing device 1804, as depicted in FIG. 6, is merely one example, and claimed subject matter is not limited in scope to this particular example. FIG. 6 may further comprise a communication interface 1830 which may comprise circuitry and/or devices to facilitate transmission of messages between second device 1804 and first device 1802 and/or third device 1806 in a physical transmission medium over network 1808 using one or more network communication techniques identified herein, for example. In a particular implementation, communication interface 1830 may comprise a transmitter device including devices and/or circuitry to modulate a physical signal in physical transmission medium according to a particular communication format based, at least in part, on a message that is intended for receipt by one or more recipient devices. Similarly, communication interface 1830 may comprise a receiver device comprising devices and/or circuitry demodulate a physical signal in a physical transmission medium to, at least in part, recover at least a portion of a message used to modulate the physical signal according to a particular communication format. In a particular implementation, communication interface may comprise a transceiver device having circuitry to implement a receiver device and transmitter device.

Computing device 1802 may provide one or more sources of executable computer instructions in the form physical states and/or signals (e.g., stored in memory states), for example. Computing device 1802 may communicate with computing device 1804 by way of a network connection, such as via network 1808, for example. As previously mentioned, a connection, while physical, may not necessarily be tangible. Although computing device 1804 shows various tangible, physical components, claimed subject matter is not limited to a computing devices having only these tangible components as other implementations and/or embodiments may include alternative arrangements that may comprise additional tangible components or fewer tangible components, for example, that function differently while achieving similar results. Rather, examples are provided merely as illustrations. It is not intended that claimed subject matter be limited in scope to illustrative examples.

Memory 1822 may comprise any non-transitory storage mechanism. Memory 1822 may comprise, for example, primary memory 1824 and secondary memory 1826, additional memory circuits, mechanisms, or combinations thereof may be used. Memory 1822 may comprise, for example, random access memory, read only memory, etc., such as in the form of one or more storage devices and/or systems, such as, for example, a disk drive including an optical disc drive, a tape drive, a solid-state memory drive, etc., just to name a few examples.

Memory 1822 may be utilized to store a program of executable computer instructions. For example, processor 1820 may fetch executable instructions from memory and proceed to execute the fetched instructions. Memory 1822 may also comprise a memory controller for accessing device readable-medium 1840 that may carry and/or make accessible digital content, which may include code, and/or instructions, for example, executable by processor 1820 and/or some other device, such as a controller, as one example, capable of executing computer instructions, for example. Under direction of processor 1820, a non-transitory memory, such as memory cells storing physical states (e.g., memory states), comprising, for example, a program of executable computer instructions, may be executed by processor 1820 and able to generate signals to be communicated via a network, for example, as previously described. Generated signals may also be stored in memory, also previously suggested.

Memory 1822 may store electronic files and/or electronic documents, such as relating to one or more users, and may also comprise a computer-readable medium that may carry and/or make accessible content, including code and/or instructions, for example, executable by processor 1820 and/or some other device, such as a controller, as one example, capable of executing computer instructions, for example. As previously mentioned, the term electronic file and/or the term electronic document are used throughout this document to refer to a set of stored memory states and/or a set of physical signals associated in a manner so as to thereby form an electronic file and/or an electronic document. That is, it is not meant to implicitly reference a particular syntax, format and/or approach used, for example, with respect to a set of associated memory states and/or a set of associated physical signals. It is further noted an association of memory states, for example, may be in a logical sense and not necessarily in a tangible, physical sense. Thus, although signal and/or state components of an electronic file and/or electronic document, are to be associated logically, storage thereof, for example, may reside in one or more different places in a tangible, physical memory, in an embodiment.

Processor 1820 may comprise one or more circuits, such as digital circuits, to perform at least a portion of a computing procedure and/or process. By way of example, but not limitation, processor 1820 may comprise one or more processors, such as controllers, microprocessors, microcontrollers, application specific integrated circuits, digital signal processors (DSPs), graphics processing units (GPUs), neural network processing units (NPUs), programmable logic devices, field programmable gate arrays, the like, or any combination thereof. In various implementations and/or embodiments, processor 1820 may perform signal processing, typically substantially in accordance with fetched executable computer instructions, such as to manipulate signals and/or states, to construct signals and/or states, etc., with signals and/or states generated in such a manner to be communicated and/or stored in memory, for example.

FIG. 6 also illustrates device 1804 as including a component 1832 operable with input/output devices, for example, so that signals and/or states may be appropriately communicated between devices, such as device 1804 and an input device and/or device 1804 and an output device. A user may make use of an input device, such as a computer mouse, stylus, track ball, keyboard, and/or any other similar device capable of receiving user actions and/or motions as input signals. Likewise, for a device having speech to text capability, a user may speak to a device to generate input signals. A user may make use of an output device, such as a display, a printer, etc., and/or any other device capable of providing signals and/or generating stimuli for a user, such as visual stimuli, audio stimuli and/or other similar stimuli.

In the preceding description, various aspects of claimed subject matter have been described. For purposes of explanation, specifics, such as amounts, systems and/or configurations, as examples, were set forth. In other instances, well-known features were omitted and/or simplified so as not to obscure claimed subject matter. While certain features have been illustrated and/or described herein, many modifications, substitutions, changes and/or equivalents will now occur to those skilled in the art. It is, therefore, to be understood that the appended claims are intended to cover all modifications and/or changes as fall within claimed subject matter.

What is claimed is:

1. A method comprising:
   providing an integrated magnetic memory device comprising a plurality of memory cells;
   writing to at least some of the plurality of memory cells according to a test pattern;
   reading states of the at least some of the plurality of memory cells;
   while the writing to the at least some of the plurality of memory cells according to the test pattern or the reading states of the at least some of the plurality of memory cells, applying a magnetic field from an external magnetic source to the integrated magnetic memory device;
   determining an observed bit error rate of the integrated magnetic memory device based, at least in part, on a comparison of the read states to the test pattern; and
   estimating an operational bit error rate of the integrated magnetic memory device in an absence of an externally applied magnetic field based, at least in part, on the observed bit error rate.

2. The method of claim 1, and further comprising:
varying the test pattern over read and write cycles; and
varying application of the magnetic field from the external magnetic source to the integrated magnetic memory device in synchronous with variations in the test pattern over the read and write cycles.

3. The method of claim 2, wherein varying application of the magnetic field from the external magnetic source to the integrated magnetic memory device comprises:
varying a polarity of the magnetic field; and/or
varying an intensity of the magnetic field.

4. The method of claim 3, wherein varying the intensity of the magnetic field comprises switching the magnetic field on and off in synchronous with read and write cycles.

5. The method of claim 1, and wherein estimating the operational bit error rate of the integrated magnetic memory device in the absence of the externally applied magnetic field further comprises:
determining an expected external magnetic field for a benchmark magnetic memory device to provide the observed bit error rate in the benchmark magnetic memory device; and
estimating the operational bit error rate of the integrated magnetic memory device in the absence of the externally applied magnetic field based, at least in part, on expected bit error rate behavior of the benchmark magnetic memory device and a difference between the expected external magnetic field for a benchmark magnetic memory device to provide the observed bit error rate in the benchmark magnetic memory device and a magnitude of the magnetic field from the external magnetic source.

6. The method of claim 1, wherein estimating the operational bit error rate of the integrated magnetic memory device in the absence of the externally applied magnetic field further comprises extrapolating the estimated operational bit error rate from a plot of bit error rate of a benchmark magnetic memory device versus a magnitude of a magnetic field applied to the benchmark magnetic memory device.

7. The method of claim 1, wherein the memory cells comprise magnetic tunnel junctions (MTJs), the MTJs comprising a fixed magnetic layer having a fixed magnetic polarization, and wherein applying the magnetic field from the external magnetic source further comprises applying the magnetic field in a same magnetic direction as the fixed magnetic polarization.

8. The method of claim 7, wherein writing to at least some of the plurality of memory cells comprises changing states of selected ones of the memory cells from a P state to an AP state according to the test pattern, and wherein determining the observed bit error rate of the integrated magnetic memory device comprises observing a write error rate based, at least in part, on states read from the selected ones of the memory cells.

9. The method of claim 1, wherein:
the memory cells comprise magnetic tunnel junctions (MTJs), the MTJs comprising a fixed magnetic layer having a fixed magnetic polarization; and
applying the magnetic field from the external magnetic source further comprises applying the magnetic field in a direction opposite the fixed magnetic polarization.

10. The method of claim 9, wherein writing to at least some of the plurality of memory cells comprises changing states of selected ones of the memory cells from an AP state to an P state according to the test pattern, and wherein determining the observed bit error rate of the integrated magnetic memory device observing a read error rate based, at least in part, on states read from the selected ones of the memory cells.

11. A computing device comprising:
one or more processors to:
obtain states read from at some of a plurality of memory cells of an integrated magnetic memory device in a read cycle, the at least some of the plurality of memory cells having been written to in a write cycle according to a test pattern, wherein a magnetic field having been applied from an external magnetic source to the integrated magnetic memory device during the write cycle or the read cycle;
determine an observed bit error rate of the integrated magnetic memory device based, at least in part, on a comparison of the read states to the test pattern; and
estimate an operational bit error rate of the integrated magnetic memory device in an absence of an externally applied magnetic field based, at least in part, on the observed bit error rate.

12. The computing device of claim 11, wherein the one or more processors are further to:
vary the test pattern over read and write cycles; and
vary application of the magnetic field from the external magnetic source to the integrated magnetic memory device in synchronous with variations in the test pattern over the read and write cycles.

13. The computing device of claim 12, wherein the one or more processors are further to:
vary a polarity of the magnetic field; and/or
varying an intensity of the magnetic field
to thereby vary application of the magnetic field from the external magnetic source to the integrated magnetic memory device.

14. The computing device of claim 13, wherein the one or more processors are further to switch the magnetic field on and off in synchronous with read and write cycles to thereby vary the intensity of the magnetic field.

15. The computing device of claim 11, and wherein the one or more processors are further to estimate the operational bit error rate of the integrated magnetic memory device in the absence of the externally applied magnetic field based, at least in part, on expected bit error rate behavior of a benchmark magnetic memory device and a difference between an expected external magnetic field for a benchmark magnetic memory device to provide the observed bit error rate in the benchmark magnetic memory device and a magnitude of the magnetic field from the external magnetic source.

16. The computing device of claim 11, wherein the one or more processors are further to extrapolate the estimated operational bit error rate from a plot of bit error rate of a benchmark magnetic memory device versus a magnitude of a magnetic field applied to the benchmark magnetic memory device.

17. The computing device of claim 11, wherein the memory cells comprise magnetic tunnel junctions (MTJs), the MTJs comprising a fixed magnetic layer having a fixed magnetic polarization, and wherein application of the magnetic field from the external magnetic source further to comprise application of the magnetic field in a same magnetic direction as the fixed magnetic polarization.

18. The computing device of claim 17, wherein the one or more processors are further to:
change states of selected ones of the memory cells from a P state to an AP state according to the test pattern; and determine the observed bit error rate of the integrated magnetic memory device based, at least in part, on an observed a write error rate based, at least in part, on states read from the selected ones of the memory cells.

19. The computing device of claim 11, wherein:

the memory cells comprise magnetic tunnel junctions (MTJs), the MTJs comprising a fixed magnetic layer having a fixed magnetic polarization; and applying the magnetic field from the external magnetic source further comprises applying the magnetic field in a direction opposite the fixed magnetic polarization.

20. An article comprising:

a non-transitory storage medium having computer-readable instructions stored thereon that are executable by one or more processors to:

obtain states read from at some of a plurality of memory cells of an integrated magnetic memory device, the at least some of the plurality of memory cells having been written to according to a test pattern, wherein a magnetic field having been applied from an external magnetic source to the integrated magnetic memory device during write cycles or read cycles;

determine an observed bit error rate of the integrated magnetic memory device based, at least in part, on a comparison of the read states to the test pattern; and estimate an operational bit error rate of the integrated magnetic memory device in an absence of an externally applied magnetic field based, at least in part, on the observed bit error rate.

* * * * *